United States Patent
Sakamoto et al.

(10) Patent No.: US 10,303,069 B2
(45) Date of Patent: May 28, 2019

(54) PATTERN FORMING METHOD AND METHOD OF MANUFACTURING ARTICLE

(71) Applicant: CANON KABUSHIKI KAISHA, Tokyo (JP)

(72) Inventors: Eiji Sakamoto, Utsunomiya (JP); Keiji Emoto, Saitama (JP); Yutaka Watanabe, Shioya-gun (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/505,999

(22) PCT Filed: Sep. 11, 2015

(86) PCT No.: PCT/JP2015/004647
§ 371 (c)(1),
(2) Date: Feb. 23, 2017

(87) PCT Pub. No.: WO2016/051690
PCT Pub. Date: Apr. 7, 2016

(65) Prior Publication Data
US 2017/0285495 A1   Oct. 5, 2017

(30) Foreign Application Priority Data

Sep. 30, 2014 (JP) ................................ 2014-202123

(51) Int. Cl.
*B41F 7/00* (2006.01)
*G03F 7/00* (2006.01)
(Continued)

(52) U.S. Cl.
CPC .............. *G03F 9/7042* (2013.01); *B41F 7/00* (2013.01); *G03F 7/0002* (2013.01); *G03F 7/7045* (2013.01); *G03F 9/7038* (2013.01)

(58) Field of Classification Search
CPC .... G03F 9/7042; G03F 7/0002; G03F 7/7045; G03F 7/7038; B41F 7/00
See application file for complete search history.

(56) References Cited

U.S. PATENT DOCUMENTS 4,910,679 A   3/1990  Takahashi et al.
7,453,161 B2  11/2008 Van Haren et al.
(Continued)

FOREIGN PATENT DOCUMENTS

CN   102037312 A   4/2011
JP   H08162392 A   6/1996
(Continued)

OTHER PUBLICATIONS

International Search Report issued in Intl. Appln. No. PCT/JP2015/004647 dated Oct. 20, 2015.
(Continued)

*Primary Examiner* — David H Banh
(74) *Attorney, Agent, or Firm* — Rossi, Kimms & McDowell LLP

(57) ABSTRACT

The present invention provides a pattern forming method of forming a plurality of pattern layers on a substrate by using a plurality of lithography apparatuses including a first lithography apparatus and a second lithography apparatus, the method comprising a first step of forming a first pattern layer by the first lithography apparatus which adopts a die-by-die alignment method, based on alignment information obtained by using the die-by-die alignment method for a plurality of marks formed on the substrate by a lithography apparatus which adopts a global alignment method, and a second step of forming a second pattern layer so as to overlap with the first pattern layer by the second lithography apparatus, based on alignment information obtained by using the global alignment method for a plurality of shot regions formed on
(Continued)

the substrate by the first lithography apparatus in the first step.

30 Claims, 9 Drawing Sheets

(51) Int. Cl.
*G03F 7/20* (2006.01)
*G03F 9/00* (2006.01)

(56) References Cited

U.S. PATENT DOCUMENTS

| | | | |
|---|---|---|---|
| 8,137,875 B2 | 3/2012 | Sjostrom et al. | |
| 2003/0218730 A1* | 11/2003 | Murakami | G03F 7/7005 355/53 |
| 2007/0020537 A1* | 1/2007 | Harakawa | G03F 7/70458 430/30 |
| 2007/0298330 A1* | 12/2007 | Chen | G03F 1/44 430/5 |
| 2011/0084417 A1 | 4/2011 | Choi et al. | |
| 2011/0290136 A1 | 12/2011 | Koga | |
| 2012/0049417 A1 | 3/2012 | Inanami | |
| 2012/0091611 A1 | 4/2012 | Yanagisawa | |
| 2012/0212715 A1* | 8/2012 | Beerens | G03F 7/70691 355/53 |
| 2013/0169946 A1* | 7/2013 | Wu | G03F 7/70358 355/53 |
| 2014/0209818 A1* | 7/2014 | Oishi | G03F 7/70491 250/492.22 |
| 2014/0291879 A1* | 10/2014 | Kruijt-Stegeman | B29C 59/022 264/40.1 |
| 2014/0322655 A1* | 10/2014 | Nishida | H01J 37/20 430/296 |
| 2017/0285495 A1* | 10/2017 | Sakamoto | G03F 9/7042 |

FOREIGN PATENT DOCUMENTS

| | | |
|---|---|---|
| JP | H08162394 A | 6/1996 |
| JP | H09007919 A | 1/1997 |
| JP | 2002246287 A | 8/2002 |
| JP | 2009076936 A | 4/2009 |
| JP | 2009212471 A | 9/2009 |
| JP | 2012049370 A | 3/2012 |
| JP | 2012227488 A | 11/2012 |
| JP | 2013030522 A | 2/2013 |
| JP | 2013507770 A | 3/2013 |
| JP | 2013258284 A | 12/2013 |

OTHER PUBLICATIONS

Written Opinion issued in Intl. Appln. No. PCT/JP2015/004647 dated Oct. 20, 2015.
Office Action issued in Chinese Appln. No. 201580052047.5 dated Dec. 4, 2017. English translation provided.
Extended European Search Report issued in European Appln. No. 15847291.0 dated Jul. 2, 2018.
Office Action issued in Japanese Appln. No. 2014-202123 dated Nov. 6, 2018.
Office Action issued in Japanese Appln. No. 2014-202123 dated May 25, 2018.

* cited by examiner

[Fig. 1A]
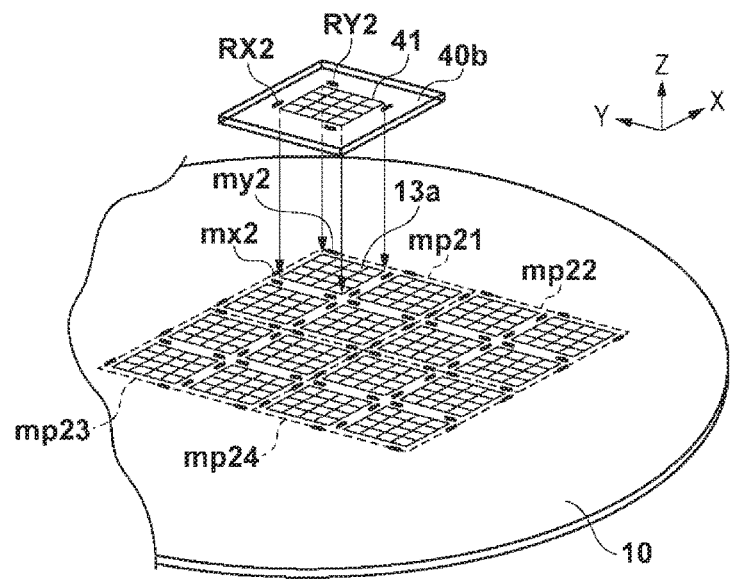
[Fig. 1B]
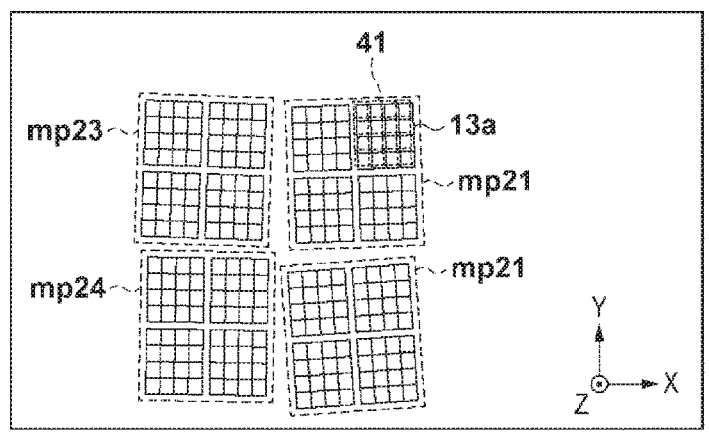
[Fig. 1C]
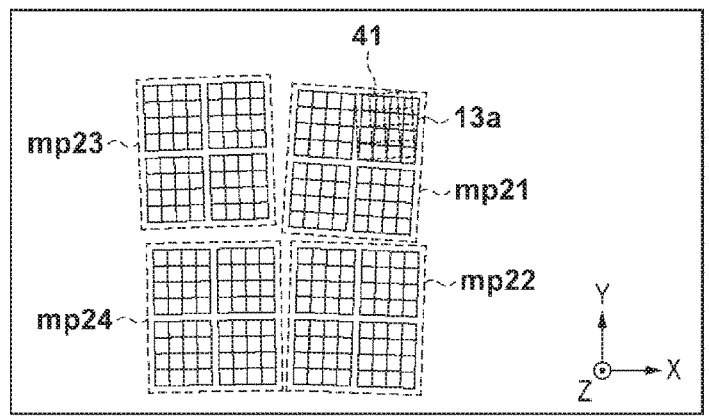

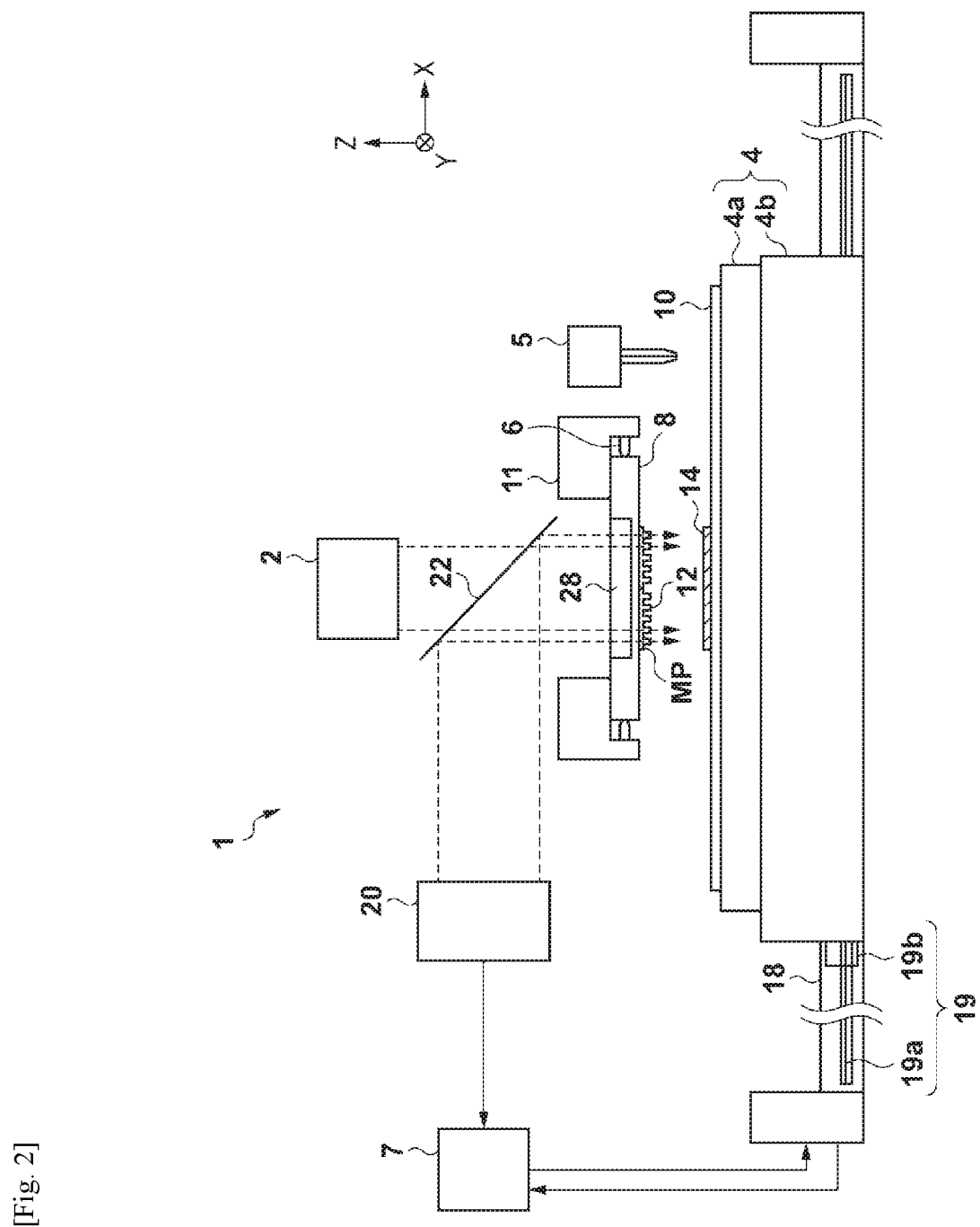
[Fig. 2]

[Fig. 3]
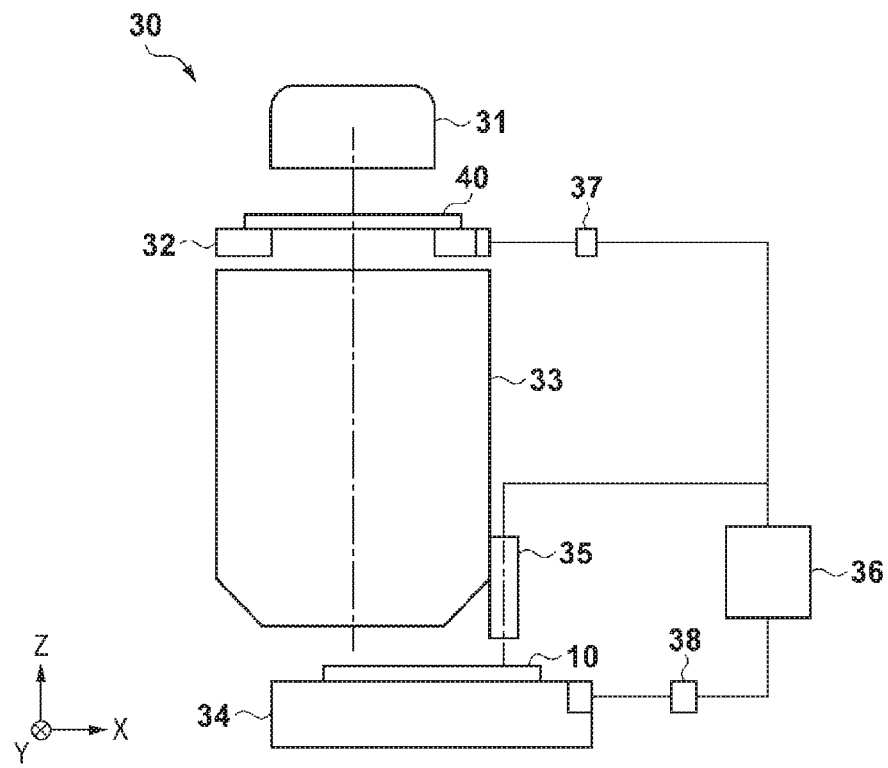
[Fig. 4]
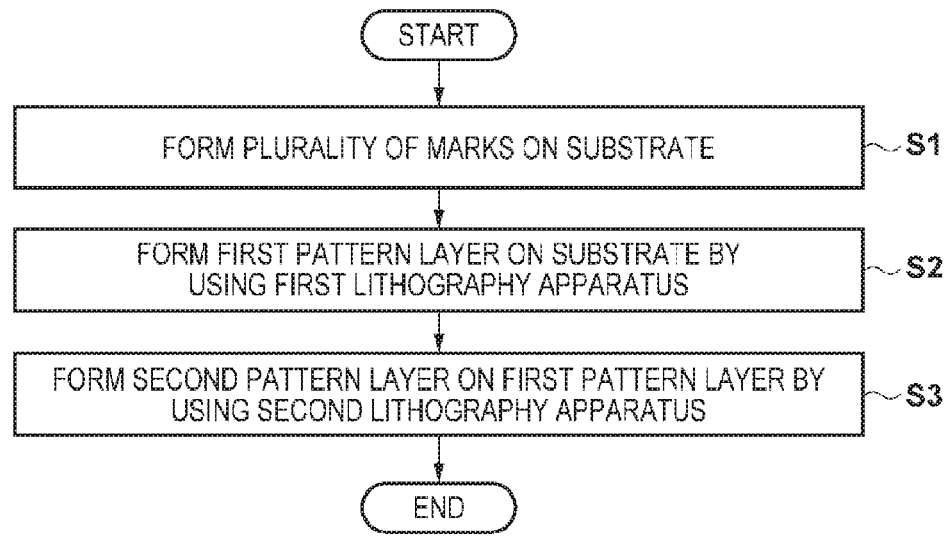

[Fig. 5A]
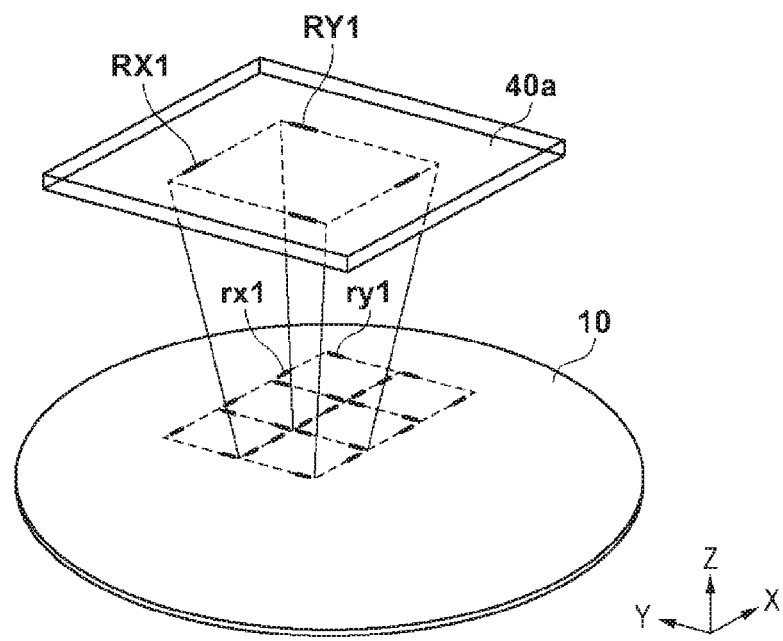
[Fig. 5B]
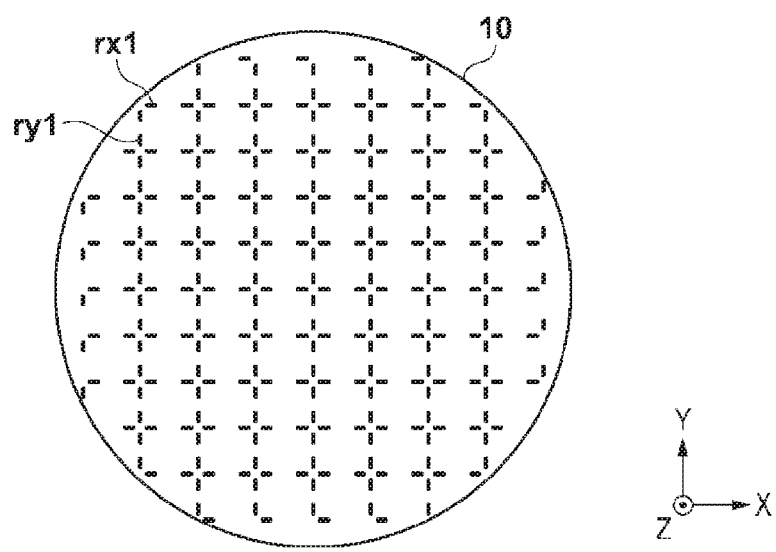

[Fig. 6A]
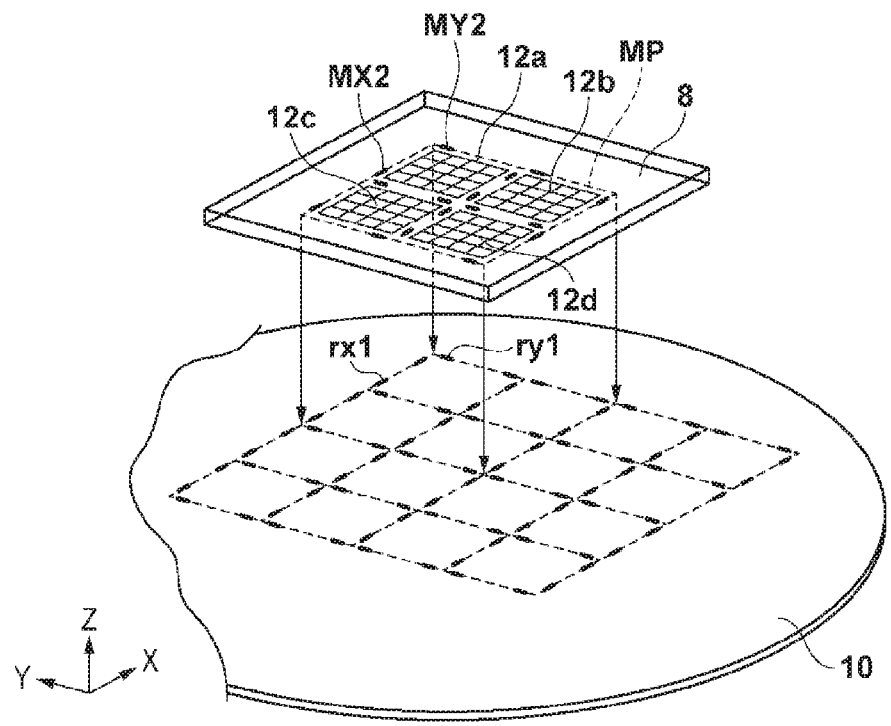
[Fig. 6B]
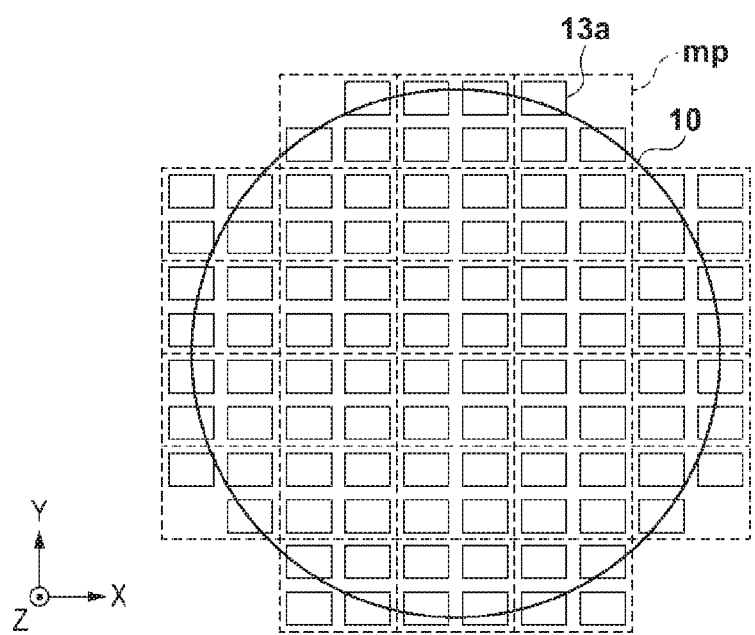

[Fig. 7]
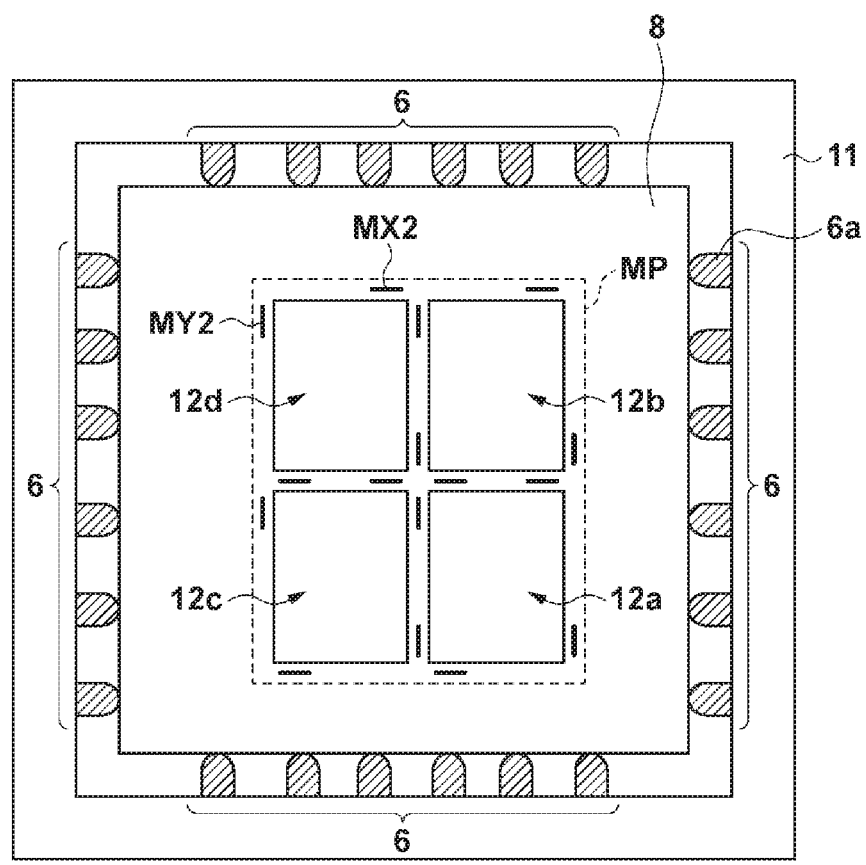

[Fig. 8]
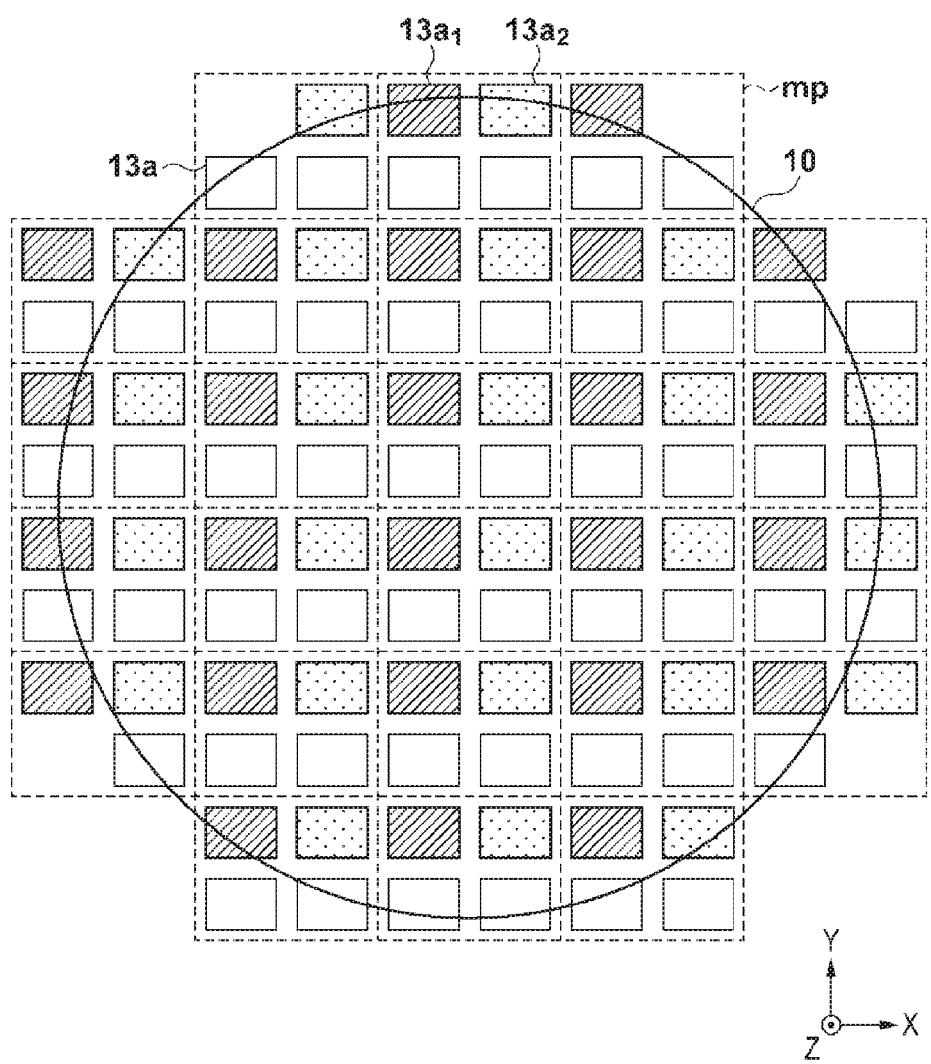

[Fig. 9A]
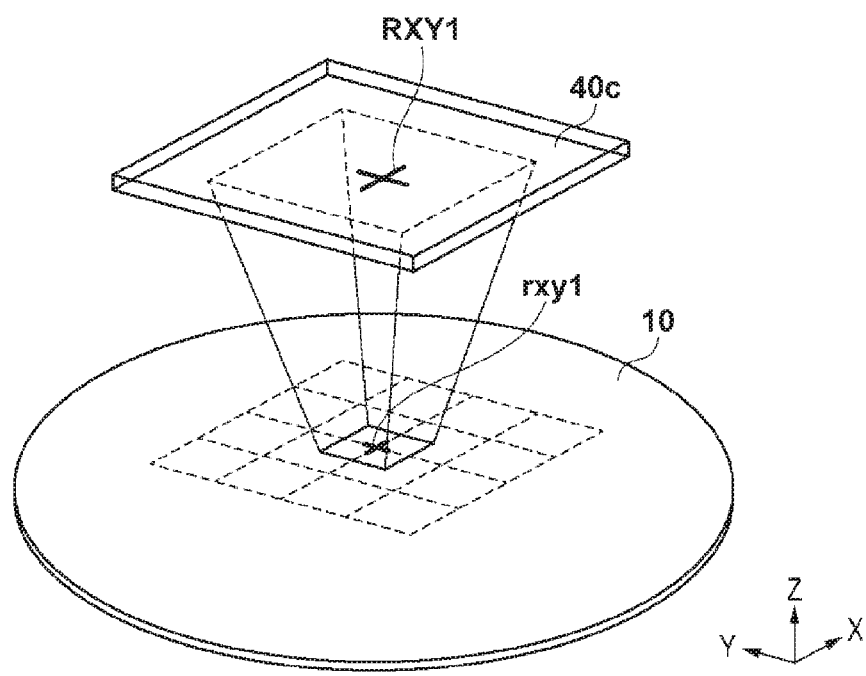
[Fig. 9B]
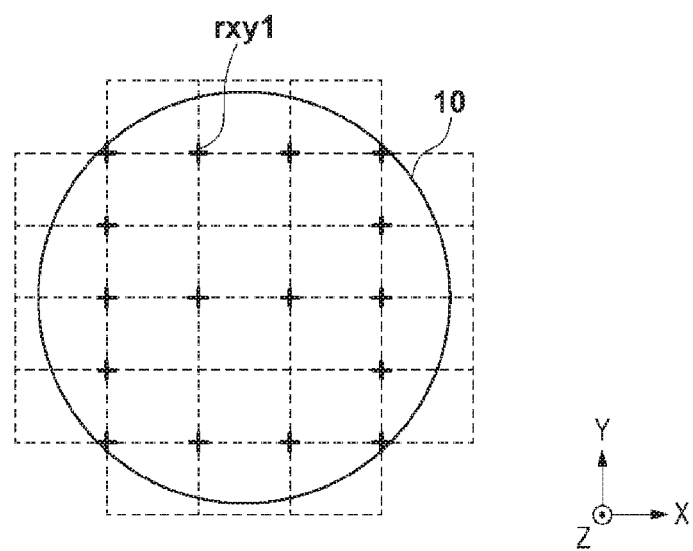

[Fig. 10A]
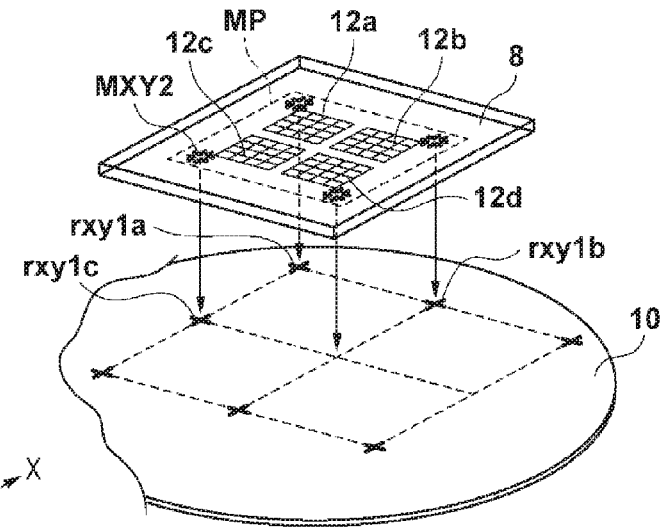
[Fig. 10B]
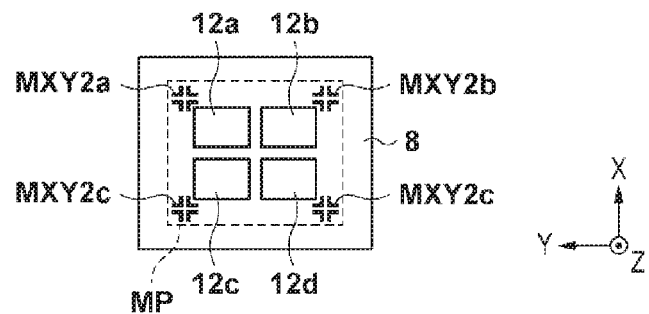
[Fig. 10C]
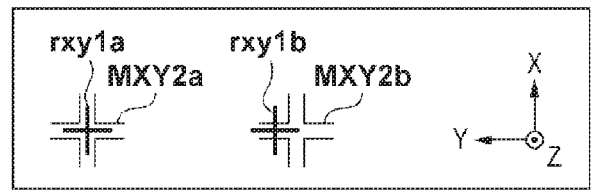
[Fig. 10D]
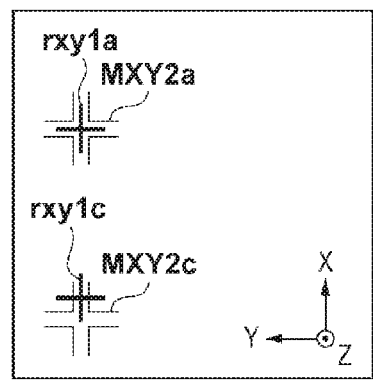

PATTERN FORMING METHOD AND METHOD OF MANUFACTURING ARTICLE

TECHNICAL FIELD

The present invention relates to a pattern forming method and a method of manufacturing an article.

BACKGROUND ART

In manufacturing a semiconductor device or the like, a step of forming a plurality of pattern layers to overlap each other on a substrate is required. Recently, a plurality of lithography apparatuses can be used in a case of forming the plurality of pattern layers on the substrate from the viewpoint of throughput and transferring precision. PTL 1 proposes a method of forming a plurality of pattern layers to overlap each other on a substrate by using different exposure apparatuses.

In an exposure apparatus, a global alignment method is in the mainstream as an alignment method between a mask and a substrate. The global alignment method performs alignment by measuring the position of a mark formed in a sample shot region on the substrate and using in common an index obtained by statistically processing the obtained measurement value in all shot regions on the substrate. If reproducibility of the arrangement of shot regions among the plurality of substrates is high, the global alignment method can use the common index (alignment information) among the plurality of substrates unless an exposure condition changes.

When forming a predetermined pattern layer out of the plurality of pattern layers, an alignment method different from the global alignment method is sometimes used. For example, in an imprint apparatus which forms a pattern in an imprint material on each substrate by using a mold, a die-by-die alignment method is in the mainstream as the alignment method between the mold and the substrate. The die-by-die alignment method performs alignment between the mold and the substrate for each shot region on the substrate. Therefore, in a case of forming the plurality of shot regions on the substrates by using a lithography apparatus (for example, an imprint apparatus) which adopts the die-by-die alignment method, the arrangement of the shot regions can change for each substrate. Therefore, when forming, by using the global alignment method, a pattern layer on the pattern layers that have been formed by using the die-by-die alignment method, it can be difficult to use the common index (alignment information) among the plurality of substrates.

CITATION LIST

Patent Literature

PTL 1: Japanese Patent Laid-Open No. 9-7919

SUMMARY OF INVENTION

The present invention provides a technique advantageous in, for example, forming a plurality of pattern layers on a substrate.

According to one aspect of the present invention, there is provided a pattern forming method of forming a plurality of pattern layers on a substrate by using a plurality of lithography apparatuses including a first lithography apparatus and a second lithography apparatus, the method comprising: a first step of forming a first pattern layer by the first lithography apparatus which adopts a die-by-die alignment method, based on alignment information obtained by using the die-by-die alignment method for a plurality of marks formed on the substrate by a lithography apparatus which adopts a global alignment method; and a second step of forming a second pattern layer so as to overlap with the first pattern layer by the second lithography apparatus, based on alignment information obtained by using the global alignment method for a plurality of shot regions formed on the substrate by the first lithography apparatus in the first step.

Further features of the present invention will become apparent from the following description of exemplary embodiments with reference to the attached drawings.

BRIEF DESCRIPTION OF DRAWINGS

FIG. 1A is a view showing an example in which the second pattern layer is formed on the first pattern layer to overlap each other;

FIG. 1B is a view showing an arrangement example of a plurality of shot regions on a substrate;

FIG. 1C is a view showing an arrangement example of the plurality of shot regions on the substrate;

FIG. 2 is a schematic view showing the arrangement of an imprint apparatus;

FIG. 3 is a schematic view showing the arrangement of an exposure apparatus;

FIG. 4 is a flowchart showing a pattern forming method;

FIG. 5A is a view showing a step of forming a plurality of marks on the substrate by using the exposure apparatus;

FIG. 5B is a view showing the substrate on which the plurality of marks have been formed;

FIG. 6A is a view showing a step of forming the first pattern layer on the substrate by using the imprint apparatus;

FIG. 6B is a view showing the substrate on which the first pattern layer has been formed;

FIG. 7 is a view showing the arrangement of a deformation unit;

FIG. 8 is a view showing the arrangement of a plurality of shot regions formed on a substrate by the first lithography apparatus;

FIG. 9A is a view showing a step of forming a plurality of marks on a substrate by using an exposure apparatus;

FIG. 9B is a view showing the substrate on which a plurality of marks have been formed;

FIG. 10A is a view showing a step of forming the first pattern layer on the substrate by using an imprint apparatus;

FIG. 10B is a view showing a mold used in the imprint apparatus;

FIG. 10C is a view for explaining alignment between the mold and the substrate in the imprint apparatus; and FIG. 10D is a view for explaining alignment between the mold and the substrate in the imprint apparatus.

DESCRIPTION OF EMBODIMENTS

Exemplary embodiments of the present invention will be described below with reference to the accompanying drawings. Note that the same reference numerals denote the same members throughout the drawings, and a repetitive description thereof will not be given. An example in which an imprint apparatus or the like is used as the first lithography apparatus which adopts a die-by-die alignment method and an exposure apparatus different from the imprint apparatus is used as the second lithography apparatus which adopts a global alignment method will be described below. Assume that each of a plurality of shot regions formed on a substrate by the first lithography apparatus includes a plurality of partial regions to each of which the pattern of an original (mask) should be transferred by the second lithography apparatus. That is, the first lithography apparatus (imprint apparatus) performs, in one shot, imprint processing (performs so-called multi-area imprint processing) on the plurality of regions to each of which the pattern of the original should be transferred by the second lithography apparatus. The present invention is not limited to a case in which the first lithography apparatus performs multi-area imprint processing. The present invention can also be applied to a case in which, for example, imprint processing operations are respectively performed on the respective regions on the substrate to each of which the pattern of the original should be transferred by the second lithography apparatus.

First Embodiment

A pattern forming method according to the first embodiment of the present invention will be described. In manufacturing a semiconductor device or the like, in general, a step of forming a pattern layer on a substrate by using a lithography apparatus is repeated, thereby overlaying a plurality of pattern layers on the substrate. Each pattern layer can be formed by performing a process such as etching on the substrate where a resist pattern is formed by the lithography apparatus. Recently, when forming the plurality of pattern layers on the substrate, each pattern layer is sometimes formed by using a plurality of lithography apparatuses and different types of alignment methods. For example, in an exposure apparatus (second lithography apparatus) which transfers the pattern of an original (mask) to a substrate via a projection optical system, a global alignment method is used as a dominant alignment method between the mask and the substrate. On the other hand, in an imprint apparatus (first lithography apparatus) which forms a pattern in an imprint material supplied onto the substrate by using an original (mold), a die-by-die alignment method is used as a dominant alignment method between the mask and the substrate.

In the global alignment method, if reproducibility of the arrangement of shot regions among a plurality of substrates falls within an allowable range, common alignment information can be used among the plurality of substrates unless an exposure condition changes. Alignment information can include, for example, arrangement information of the shot regions on the substrates and information on the correction amount of the shape of each shot region. However, when forming the plurality of shot regions on the substrates by using the lithography apparatus (imprint apparatus) which adopts the die-by-die alignment method, the arrangement of the shot regions can change for each substrate. Therefore, when forming, by using the global alignment method, a pattern layer on the pattern layers that have been formed by using the die-by-die alignment method, it can be difficult to use common alignment information among the plurality of substrates.

FIGS. 1A to 1C are views showing an example in which the exposure apparatus which adopts the global alignment method forms the second pattern layer on the first pattern layer formed by the imprint apparatus which adopts the die-by-die alignment method to overlap each other. Unlike the imprint apparatus, the exposure apparatus transfers a pattern 41 of a mask 40b to each of a plurality of partial regions 13a in respective shot regions mp21 to mp24 formed on a substrate 10 by the imprint apparatus, as shown in FIG. 1A. For example, the exposure apparatus measures the positions of marks mx2 and my2 provided on the substrate 10 and obtains arrangement information (alignment information) of the shot regions (partial regions) on the substrate. Then, in accordance with obtained alignment information, the pattern 41 of the mask 40b is transferred to each of the plurality of partial regions 13a (shot regions) on the substrate. This makes it possible to transfer the pattern 41 of the mask 40b to each of the plurality of partial regions 13a on the substrate, and to form the second pattern layer on the first pattern layer formed by the imprint apparatus to overlap each other. If a shape difference occurs between the pattern 41 of the mask 40b and each partial region 13a on the substrate, the shape difference can be corrected in actual exposure by forming their patterns on a test substrate in advance, and measuring a position deviation and a deformation amount between their patterns. Note that each shot region corresponds to a pattern region formed on the mold when forming a pattern in the pattern layer by using the imprint apparatus, while it corresponds to a pattern region formed on the mask when forming a pattern in the pattern layer by using the exposure apparatus different from the imprint apparatus. FIGS. 1A to 1C are views showing a case in which the shot regions mp21 to mp24 formed in the first pattern layer and the shot regions 13a formed in the second pattern layer differ in size. In FIGS. 1A to 1C, each of the shot regions mp21 to mp24 formed by the imprint apparatus includes the plurality of shot regions 13a which should be formed by the exposure apparatus.

As described above, if reproducibility of the arrangement of the shot regions (partial regions) among the plurality of substrates falls within the allowable range, the exposure apparatus which adopts the global alignment method can use common alignment information among the plurality of substrates unless the exposure condition changes. However, since alignment is performed for each shot region on the substrates in the imprint apparatus, the arrangement of the shot regions (partial regions) can change for each substrate when forming the plurality of shot regions on the substrates by the imprint apparatus. Assume a case in which, for example, the first pattern layer is formed on each of the plurality of substrates 10 by the imprint apparatus. At this time, the plurality of shot regions mp21 to mp24 can be arranged on the one substrate 10 as shown in FIG. 1B, and the plurality of shot regions mp21 to mp24 can be arranged on the other substrate 10 as shown in FIG. 1C. Therefore, reproducibility of the arrangement of the shot regions (partial regions) among the plurality of substrates falls outside the allowable range, and it can be difficult to use common alignment information among the plurality of substrates. Such a difference in the arrangement of the shot regions among the plurality of substrates when forming the first pattern layer by the imprint apparatus becomes particularly conspicuous when forming, by performing imprint processing, the first pattern layer on the substrate on which no patterns or marks have been formed. This is because alignment between the mold and each substrate 10 cannot be performed with reference to signs (for example, the marks) provided on each substrate.

Therefore, the pattern forming method of the first embodiment forms the first pattern layer by the imprint apparatus (first lithography apparatus) based on the position of each of the plurality of marks formed on the substrate by the lithography apparatus which adopts the global alignment method. Then, in accordance with alignment information obtained by the global alignment method and targeted for the plurality of shot regions (partial regions) formed on each substrate by the imprint apparatus, the exposure apparatus forms the second pattern layer on the first pattern layer to overlap each other. That is, the pattern forming method of the first embodiment forms the first pattern layer by the imprint apparatus with reference to the plurality of marks formed on the substrate by the exposure apparatus which adopts the global alignment method. Then, the exposure apparatus forms the second pattern layer on the first pattern layer. Note that the exposure apparatus configured to form the plurality of marks may be the exposure apparatus (second lithography apparatus) configured to form the second pattern layer.

In general, the exposure apparatus is configured to be able to perform position control of a substrate stage which holds the substrate 10 more precisely than the imprint apparatus. Therefore, the exposure apparatus can form the plurality of marks precisely even on the substrate 10 where no patterns or marks have been formed. That is, the exposure apparatus can arrange the plurality of marks among the plurality of substrates with high reproducibility even if it forms the plurality of marks on the substrates only by performing position control of the substrate stage. It is therefore possible to improve reproducibility of the arrangement of the shot regions among the plurality of substrates by forming the first pattern layer using the imprint apparatus with reference to the plurality of marks formed by the exposure apparatus. As a result, common alignment information can be used among the plurality of substrates when forming the second pattern layer on the first pattern layer by the exposure apparatus. The pattern forming method of this embodiment will be described below.

Arrangement of Imprint Apparatus 1

First, the arrangement of the imprint apparatus 1 configured to form the first pattern layer on the substrate will be described with reference to FIG. 2. The imprint apparatus 1 performs imprint processing of forming an imprint material 14 on the substrate by using a mold 8 on which a pattern 12 and marks (alignment marks) have been formed. For example, the imprint apparatus 1 cures the imprint material 14 in a state in which the mold 8 is brought into contact with the imprint material 14 on the substrate. Then, the imprint apparatus 1 can form a pattern made of the imprint material 14 on the substrate by widening the spacing between the mold 8 and the substrate 10, and separating (releasing) the mold 8 from the cured imprint material 14. A method of curing the imprint material 14 includes a heat cycle method using heat and a photocuring method using light. In the first embodiment, an example in which the photocuring method is adopted will be described. The photo-curing method is a method of curing the imprint material 14 by supplying an uncured ultraviolet-curing resin as the imprint material 14 onto the substrate, and irradiating the imprint material 14 with light (ultraviolet rays) in a state in which the mold 8 and the imprint material 14 are in contact with each other.

FIG. 2 is a schematic view showing the arrangement of the imprint apparatus 1 configured to form the first pattern layer on the substrate. The imprint apparatus 1 can include a light irradiation unit 2, a mold holding unit 11, a substrate stage 4, a supply unit 5, an alignment measurement unit 20, and a control unit 7. The control unit 7 includes, for example, a CPU and a memory, and controls imprint processing (controls the respective units of the imprint apparatus 1).

In imprint processing, the light irradiation unit 2 irradiates, through the mold 8, the imprint material 14 on the substrate with light (ultraviolet rays) which cures the imprint material 14. The light irradiation unit 2 can include, for example, an optical element which adjusts light emitted from the light source to light suitable for imprint processing. For example, when the heat cycle method is adopted, a heat source unit which applies, to the imprint material 14, heat for curing a thermosetting resin as the imprint material 14 is provided instead of the light irradiation unit 2.

The mold 8 has a rectangular outer shape and a pattern portion MP where the three-dimensional pattern 12 which may be a circuit pattern that should be transferred to the substrate 10 has been formed on a surface facing the substrate 10. The pattern portion MP of the mold 8 in this embodiment includes four patterns 12a to 12d. However, the present invention is not limited to this, and the pattern portion MP may include the one or the plurality of patterns 12. The mold 8 is made of, for example, a material such as quartz capable of transmitting ultraviolet rays. The mold 8 may include a cavity 28 (concave portion) on a surface on the opposite side of the surface having the pattern portion MP.

For example, the mold holding unit 11 can be configured to hold and move the mold 8. The mold holding unit 11 can hold the mold 8 by chucking it with, for example, a vacuum suction force or an electrostatic force. For example, when the mold holding unit 11 holds the mold 8 with the vacuum suction force, the mold holding unit 11 is connected to an externally installed vacuum pump (not shown) and attachment/detachment of the mold 8 is switched by turning on/off the vacuum pump. The mold holding unit 11 has an aperture region at its center portion (inside) so as to irradiate the substrate 10 with light emitted by the light irradiation unit 2. This aperture region includes a light-transmitting member (for example, a glass plate) configured to make a space including a part of the aperture region and the cavity 28 of the mold into a substantially sealed space. A pressure regulator (not shown) including the vacuum pump or the like can regulate a pressure inside the space. For example, when bringing the mold 8 and the imprint material 14 on the substrate into contact with each other, the pressure regulator can deform the pattern portion MP into a convex shape toward the substrate 10 by making the pressure inside the space higher than an outside pressure. This makes it possible to gradually bring the pattern portion MP into contact with the imprint material 14 from its center portion, and to prevent a gas (air) from being trapped between the imprint material 14 and the concave portion of the pattern 12 of the mold 8. As a result, the imprint material 14 can fill in every corner of the pattern 12 of the mold 8, making it possible to prevent a loss from being caused in the pattern made of the imprint material 14.

Further, the mold holding unit 11 includes an actuator such as a linear motor or an air cylinder, and drives the mold 8 in the Z direction to bring the mold 8 and the imprint material 14 on the substrate into contact with each other or separate them from each other. The mold holding unit 11 is required to perform alignment precisely when bringing the mold 8 and the imprint material 14 into contact with each other. Therefore, the mold holding unit 11 may be formed by a plurality of driving systems such as a coarse driving system and a fine driving system. In addition to the function of driving the mold in the Z direction, the mold holding unit 11 may have a position adjustment function of adjusting the position of the mold 8 in X and Y directions and a q direction (a rotation direction about a Z-axis), a tilt function of correcting the tilt of the mold 8, and the like. In the imprint apparatus 1 of the first embodiment, the mold holding unit 11 performs an operation of changing the distance between the mold 8 and the substrate 10. However, a substrate driving unit 4b of the substrate stage 4 may perform that operation or both of the mold holding unit 11 and the substrate driving unit 4b may relatively perform that operation.

As the substrate 10, for example, a single-crystal silicon substrate or an SOI (Silicon on insulator) substrate is used. The supply unit 5 supplies the imprint material 14 to the upper surface (processed surface) of the substrate 10.

The substrate stage 4 includes a substrate holding unit 4a and the substrate driving unit 4b, and performs alignment between the mold 8 and the substrate 10 by moving the mold 8 and the imprint material 14 in the X direction and the Y direction when bringing them into contact with each other. The substrate holding unit 4a holds the substrate 10 by, for example, a vacuum suction force or an electrostatic force. The substrate driving unit 4b includes an actuator such as a linear motor or a pulse motor, and drives the substrate holding unit 4a (substrate 10) along a guide 18 in the X direction and the Y direction. The substrate driving unit 4b may be formed by a plurality of driving systems such as a coarse driving system and a fine driving system in the X direction and the Y direction, respectively. Also, the substrate driving unit 4b may have a driving function of driving the substrate 10 in the Z direction, a position adjustment function of adjusting the position of the substrate 10 by rotatably driving the substrate 10 in the q direction, a tilt function of correcting the tilt of the substrate 10, and the like. In the imprint apparatus 1 of the first embodiment, the substrate driving unit 4b performs alignment between the mold 8 and the substrate 10. However, the mold holding unit 11 may perform alignment or both of the substrate driving unit 4b and the mold holding unit 11 may relatively perform alignment.

The position of the substrate stage 4 can be measured by an encoder 19 including a scale 19a provided in the guide 18 and a sensor 19b which irradiates the surface of the scale 19a with light and receives reflected light from the scale 19a. The sensor 19b can be provided in, for example, the substrate driving unit 4b. In the imprint apparatus 1 of the first embodiment, the position of the substrate stage 4 is measured by using the encoder 19. However, the present invention is not limited to this, and the position of the substrate stage 4 maybe measured by using, for example, a laser interferometer. For example, the laser interferometer can irradiate the side surface of the substrate stage 4 with a laser beam, detect a displacement from a reference position on the substrate stage 4 based on the laser beam reflected by the side surface, and measure the position of the substrate stage 4. The position of the mold holding unit 11 can also be measured by using the encoder or the laser interferometer as in the measurement of the position of the substrate stage 4.

The alignment measurement unit 20 detects, via a half mirror 22, the marks provided on the mold and the marks provided on the substrate, and measures the relative positions of the marks on the mold and the marks on the substrate based on that detection result. The control unit 7 controls the mold holding unit 11 and the substrate stage 4 such that the relative positions of the marks on the mold and the marks on the substrate measured by the alignment measurement unit 20 become target relative positions, thereby aligning the mold 8 and the substrate 10. The supply unit 5 supplies (applies) the imprint material 14 (uncured resin) onto the substrate. As described above, in the imprint apparatus 1 of the first embodiment, an ultraviolet-curing resin having a property that is cured upon ultraviolet irradiation is used as the imprint material 14.

Arrangement of Exposure Apparatus 30

The arrangement of the exposure apparatus 30 configured to form the plurality of marks and the second pattern layer on the substrate will now be described with reference to FIG. 3. FIG. 3 is a schematic view showing the arrangement of the exposure apparatus. A step and scan type exposure apparatus (scanner) which transfers the pattern of an original (mask 40) onto the substrate via a projection optical system 33 will be described here. However, a step and repeat type exposure apparatus (stepper) may be used. The exposure apparatus 30 can include, for example, an illumination optical system 31, a mask stage 32, the projection optical system 33, a substrate stage 34, an alignment measurement unit 35, and a control unit 36. The control unit 36 includes, for example, a CPU and a memory, and controls exposure processing (controls the respective units of the exposure apparatus 30).

Light emitted from a light source (not shown) enters the illumination optical system 31 and forms, on the mask, a long band-like or an arcuate slit-shaped exposure area in, for example, the X direction. The mask 40 and the substrate 10 are held by the mask stage 32 and the substrate stage 34 respectively, and are arranged in almost optically conjugate positions (the object plane and the image plane of the projection optical system 33) via the projection optical system 33. The projection optical system 33 has a predetermined projection magnification (for example, ×1 or ×½), and projects the pattern formed on the mask 40 onto the substrate 10. The mask stage 32 and the substrate stage 34 are scanned at a velocity ratio corresponding to the projection magnification of the projection optical system 33 in synchronism with each other in a direction (for example, the Y direction) perpendicular to the optical axis direction (Z direction) of the projection optical system 33. This makes it possible to transfer the pattern formed on the mask 40 to each shot region (partial region 13a) on the substrate. By repeating this scanning exposure with respect to each of the plurality of shot regions (partial regions 13a) on the substrate while moving the substrate stage 34 step by step, exposure processing on the one substrate 10 can be completed.

A first measurement unit 37 measures the position of the mask stage 32. The first measurement unit 37 includes, for example, a laser interferometer, irradiates the side surface of the mask stage 32 with light, and obtains a displacement from a reference position on the mask stage 32 based on light reflected by the side surface. This allows the first measurement unit 37 to measure the position of the mask stage 32. A second measurement unit 38 measures the position of the substrate stage 34. The second measurement unit 38 includes, for example, a laser interferometer, irradiates the side surface of the substrate stage 34 with light, and obtains a displacement from a reference position on the substrate stage 34 based on light reflected by the side surface. This allows the second measurement unit 38 to measure the position of the substrate stage 34.

The alignment measurement unit 35 measures the positions of some representative shot regions (sample shot regions) out of the plurality of shot regions (partial regions 13a) on the substrate in order to perform alignment between the mask 40 and the substrate 10 using the global alignment method. This allows the control unit 36 to obtain the common index (alignment information) used in all the shot regions on the substrate by performing statistical processing on the position of each sample shot region measured by the alignment measurement unit 35. In the first embodiment, the alignment measurement unit 35 is provided as an off-axis measurement unit which measures the position of each sample shot region without intervening the projection optical system 33. However, the present invention is not limited to this. The alignment measurement unit 35 may be provided as, for example, a TTL (Through The Lens) measurement unit which measures the position of each sample shot region via the projection optical system 33.

Pattern Forming Method

The pattern forming method of this embodiment will now be described with reference to FIG. 4. FIG. 4 is a flowchart showing the pattern forming method according to this embodiment. In step S1, the plurality of marks are formed on the substrate by using the lithography apparatus (exposure apparatus) which adopts the global alignment method. As described above, the lithography apparatus configured to form the plurality of marks on the substrate may be the second lithography apparatus (exposure apparatus 30) configured to form the second pattern layer on the substrate. FIG. 5A is a view showing a step of forming the plurality of marks on the substrate by using the exposure apparatus 30. In this step, for example, processing of transferring, by using a mask 40a on which a plurality of marks RX1 and RY1 have been formed, the plurality of marks RX1 and RY1 provided on the mask 40a onto the substrate by the exposure apparatus 30 is repeated, as shown in FIG. 5A. This makes it possible to form a plurality of marks rx1 and ry1 on the substrate, as shown in FIG. 5B. By forming the plurality of marks on the substrate with the exposure apparatus 30 as described above, the plurality of marks can be arranged on each substrate among the plurality of substrates with high reproducibility.

As described above, the effect of the present invention becomes particularly conspicuous when using the substrate 10 on which no patterns or marks have been formed. However, the effect of the present invention can also be obtained when using the substrate 10 on which the patterns and the marks have been formed. Therefore, although FIG. 5A shows an example in which the plurality of marks are formed on the substrate 10 on which no patterns or marks have been formed, the present invention is not limited to this. For example, in step S1, the plurality of marks may be formed on the substrate on which the patterns and the marks have been formed. In step S1 of this embodiment, an example in which only the plurality of marks are formed on the substrate has been shown. In addition to the plurality of marks, however, patterns may be formed on the substrate.

In step S2 (first step), based on the position in each of the plurality of marks formed on the substrate by the lithography apparatus which adopts the global alignment method, the first lithography apparatus (imprint apparatus 1) forms the first pattern layer on the substrate. FIG. 6A is a view showing a step of forming the first pattern layer on the substrate by using the imprint apparatus 1. In this step, imprint processing of transferring, onto the substrate, the plurality (four) of patterns 12a to 12d provided on the mold 8 having the pattern portion MP which includes the plurality of patterns 12a to 12d and a plurality of marks MX2 and MY2 is repeated by using the mold 8.

In each imprint processing operation, alignment between the mold 8 and the substrate 10 by the die-by-die alignment method is performed in the state in which the mold 8 and the imprint material 14 on the substrate are in contact with each other. The substrate stage 4 can be controlled such that, for example, the relative positions of the plurality of marks rx1 and ry1 formed on the substrate in step S1 and the plurality of marks MX2 and MY2 provided in the pattern portion MP of the mold 8 in the XY direction become target relative positions. The imprint material 14 in contact with the mold 8 is irradiated with light (ultraviolet rays) and cured. Then, the mold 8 is separated from the cured imprint material 14. This makes it possible to transfer the plurality of patterns 12a to 12d provided on the mold 8 onto the substrate. By repeating the imprint processing over the entire surface of the substrate 10, the first pattern layer can be formed on the substrate, as shown in FIG. 6B. By forming the first pattern layer on the substrate by the imprint apparatus 1 with reference to the plurality of marks formed on the substrate by the exposure apparatus 30 as described above, a plurality of shot regions trip can be arranged among the plurality of substrates with high reproducibility. Note that each shot region mp formed on the substrate by the imprint apparatus 1 can include, as shown in FIG. 6B, the plurality of partial regions 13a to each of which the pattern of the mask 40 should be transferred by the exposure apparatus 30 in step S3.

Note that the pattern portion MP of the mold 8 may, for example, have a shape including a component such as a magnification component or a trapezoidal component owing to a manufacturing error, thermal deformation, or the like. To cancel this, a deformation unit 6 (mold shape correction mechanism) that deforms the pattern portion MP by adding a force to a plurality of portions on the side surface of the mold 8 may be provided for the mold holding unit 11 of the imprint apparatus 1. FIG. 7 is a view showing the arrangement of the deformation unit 6 when the mold 8 is viewed from the lower side (−Z direction). The deformation unit 6 includes, for example, a plurality of actuators 6a. In an example shown in FIG. 7, six actuators 6a are provided for each side of the mold 8. Each actuator 6a adds a force to the side surface of the mold 8 individually, thereby deforming the pattern portion MP of the mold 8. In step S2, the imprint apparatus 1 may perform alignment between the mold 8 and the substrate 10 by deforming the pattern portion MP of the mold 8 with the deformation unit 6.

In step S3 (second step), the second lithography apparatus (exposure apparatus 30) forms the second pattern layer to overlap on the first pattern layer formed on the substrate by the first lithography apparatus (imprint apparatus 1) in step S2. For example, the exposure apparatus 30 obtains, by the global alignment method, alignment information targeted for the plurality of shot regions mp (partial regions 13a) formed on the substrate by the first lithography apparatus (imprint apparatus 1). Alignment information obtained as described above can have almost the same value among the plurality of substrates because the plurality of shot regions mp are arranged among the plurality of substrates with high reproducibility by steps S1 and S2. Therefore, the alignment information can be used in common among the plurality of substrates. Then, as shown in FIG. 1A, the exposure apparatus 30 performs, in accordance with obtained alignment information, scanning exposure of transferring the pattern 41 of the mask 40b on each of the plurality of partial regions 13a on the substrate. This allows the exposure apparatus 30 to transfer the pattern 41 of the mask 40b to each of the plurality of partial regions 13a in each shot region mp, and to form the second pattern layer on the first pattern layer.

As described above, the pattern forming method of the first embodiment forms the first pattern layer by the imprint apparatus 1 based on the position in each of the plurality of marks formed on the substrate by the lithography apparatus which adopts the global alignment method. Then, in accordance with alignment information obtained by the global alignment method and targeted for the plurality of shot regions mp formed on the substrate by the first lithography apparatus, the exposure apparatus 30 forms the second pattern layer on the first pattern layer to overlap each other. Through these steps, common alignment information can be used among the plurality of substrates even if the pattern layer is formed, by using the global alignment method, on the pattern layer that has been formed by using the die-by-die alignment method.

Second Embodiment

In the first embodiment, the example in which imprint processing is performed (the example in which multi-area imprint processing is performed) by using the mold 8 on which the plurality of patterns 12 have been formed in the imprint apparatus 1 has been described. In the mold 8 on which the plurality of patterns 12 have been formed as described above, the shape and the orientation of each pattern 12 on the mold are sometimes different owing to the manufacturing error or the like. As a result, the shape and the orientation are different among the plurality of partial regions 13a in the one shot region mp. In this case, if alignment information is used in common among the plurality of partial regions 13a in the one shot region mp, it can be difficult for the exposure apparatus 30 to transfer the pattern 41 of the mask 40b to each partial region 13a precisely. Therefore, in the second embodiment, alignment information is obtained for each position of partial regions 13a in each shot region mp formed on the substrate by the first lithography apparatus (imprint apparatus 1). Then, a pattern 41 of a mask 40b is transferred by using different pieces of alignment information with respect to each of the plurality of partial regions 13a included in each shot region mp.

For example, as shown in FIG. 8, assume a case in which each shot region mp includes a plurality (four) of partial regions 13a including a first partial region $13a_1$ and a second partial region $13a_2$. In this case, in step S3 of the flowchart shown in FIG. 4, an exposure apparatus 30 obtains, by a global alignment method, alignment information (first alignment information) targeted for the first partial region $13a_1$ arranged on the upper left of each shot region mp. For example, the exposure apparatus 30 obtains, by the global alignment method, first alignment information by using marks provided in some of the representative first partial regions $13a_1$ out of the plurality of first partial regions $13a_1$ on the substrate. Similarly, the exposure apparatus 30 obtains, by the global alignment method, alignment information (second alignment information) targeted for the second partial region 13a, arranged on the upper right of each shot region mp. For example, the exposure apparatus 30 obtains, by the global alignment method, second alignment information by using marks provided in some of the representative second partial regions $13a_2$ out of the plurality of second partial regions $13a_2$ on the substrate. The exposure apparatus 30 uses first alignment information when transferring the pattern 41 of the mask 40b to each of the plurality of first partial regions $13a_1$ and uses second alignment information when transferring the pattern 41 of the mask 40b to each of the plurality of second partial regions $13a_2$. This makes it possible to transfer the pattern 41 of the mask 40b to each of the plurality of partial regions 13a precisely even if a shape and an orientation are different among the plurality of partial regions 13a included in each shot region mp on the substrate.

Note that in step S3 of the flowchart shown in FIG. 4, processing of transferring the pattern 41 of the mask 40b by the exposure apparatus 30 may be performed in an order corresponding to the position of the partial regions 13a in each shot region mp. For example, processing of transferring the pattern 41 of the mask 40b to each first partial region 13a, by the exposure apparatus 30 is performed on the plurality of shot regions mp on the substrate. After that, processing of transferring the pattern 41 of the mask 40b to each second partial region $13a_2$ may be performed on the plurality of shot regions mp on the substrate. In this case, it is also possible to use first alignment information when transferring the pattern 41 of the mask 40b to each of the plurality of first partial regions $13a_1$ and use second alignment information when transferring the pattern 41 of the mask 40b to each of the plurality of second partial regions $13a_2$.

Third Embodiment

In the first embodiment, the example in which the plurality of marks are formed on the substrate 10 by using the exposure apparatus 30 so as to correspond to each of the plurality of patterns 12 formed on the mold 8 in step S1 has been described. In step S2, however, only some of the marks out of the plurality of marks formed on the substrate are used when performing alignment between the mold 8 and the substrate 10. Therefore, in order to increase throughput, only the marks in number required to perform alignment between the mold 8 and the substrate 10 in step S2 may be formed on the substrate in step S1. Therefore, in the third embodiment, an example in which marks in number required to perform alignment between a mold 8 and a substrate 10 in step S2 are formed on the substrate will be described.

FIG. 9A is a view showing step St of forming the plurality of marks on the substrate by using an exposure apparatus 30. For example, as shown in FIG. 9A, a mask 40c used by the exposure apparatus 30 in step S1 includes, at its center, across-shaped mark RXY1 which can measure a position in the X direction and the Y direction. A mark rxy1 is formed on the substrate through exposure processing. In step S1, the plurality of marks rxy1 are formed on the substrate by using the exposure apparatus 30 so as to provide at least two of the marks rxy1 for each shot region mp that should be formed on the substrate by the first lithography apparatus in step S2, as shown in FIG. 9B.

FIG. 10A is a view showing step S2 of forming the first pattern layer on the substrate by using an imprint apparatus 1. As shown in FIG. 10A, the mold 8 used by the imprint apparatus 1 in step S2 includes a plurality of marks MXY2 for performing alignment with the marks rxy1 formed on the substrate. FIG. 10B is a view showing the mold 8 used by the imprint apparatus 1 in step S2. In a pattern portion MP of the mold 8, a plurality (four) of patterns 12a to 12d are formed at its center portion and marks MXY2a to MXY2d are formed at the four corners.

Alignment between the mold 8 and the substrate 10 in the imprint apparatus 1 will now be described. FIGS. 10C and 10D are views for explaining alignment between the mold 8 and the substrate 10 in the imprint apparatus 1. For example, as shown in FIGS. 10C and 10D, the imprint apparatus 1 controls a substrate stage 4 such that the relative positions of a mark rxy1a on the substrate and the mark MXY2a on the mold become target relative positions. Then, the imprint apparatus 1 controls the substrate stage 4 and a deformation unit 6 such that the relative positions of a mark rxy1b on the substrate and the mark MXY2b on the mold become target relative positions. Similarly, the imprint apparatus 1 controls the substrate stage 4 and the deformation unit 6 such that the relative positions of a mark rxy1c on the substrate and the mark MXY2c on the mold become target relative positions. This makes it possible to transfer the patterns 12a to 12d of the mold 8 onto the substrate with reference to the plurality of marks rxy1 formed on the substrate in step S1. It is therefore possible to arrange the plurality of shot regions among a plurality of substrates with high reproducibility.

In step S3, in accordance with alignment information targeted for the plurality of shot regions mp (partial regions 13a) formed on the substrate by the imprint apparatus 1, the second pattern layer is formed on the first pattern layer to overlap each other by the exposure apparatus 30. In the third embodiment, common alignment information can also be used among the plurality of substrates because the plurality of shot regions mp are arranged among the plurality of substrates with high reproducibility by steps S1 and S2.

Embodiment of Method of Manufacturing Article

A method of manufacturing an article according to an embodiment of the present invention is suitable for manufacturing an article, for example, an electronic device such as a semiconductor device or an element having a microstructure. The method of manufacturing the article according to this embodiment includes a step of forming a latent image pattern on a photoresist applied to a substrate using the above-described pattern forming method (step of exposing the substrate) and a step of processing the substrate on which the latent image pattern has been formed in the preceding step. This manufacturing method further includes other known steps (oxidation, deposition, vapor deposition, doping, planarization, etching, resist peeling, dicing, bonding, packaging, and the like). The method of manufacturing the article according to this embodiment is advantageous in at least one of the performance, the quality, the productivity, and the production cost of the article, as compared with a conventional method.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-202123 filed on Sep. 30, 2014, which is hereby incorporated by reference herein in its entirety.

The invention claimed is:

1. A pattern forming method of forming a plurality of pattern layers on a substrate by using a plurality of lithography apparatuses including a first lithography apparatus adopting a die-by-die alignment method and a second lithography apparatus adopting a global alignment method, the pattern forming method comprising:
   forming only a plurality of alignment marks on the substrate, by using a lithography apparatus which adopts a global alignment method;
   forming a first pattern layer on the substrate by using the first lithography apparatus, based on first alignment information obtained by performing the die-by-die alignment method for the plurality of marks formed on the substrate; and then
   forming a second pattern layer on the substrate so as to overlap with the first pattern layer, by using the second lithography apparatus, based on second alignment information obtained by performing the global alignment method for a plurality of shot regions in the first pattern layer to which patterns have been respectively formed by the first lithography apparatus.

2. The method according to claim 1, wherein each of the plurality of shot regions formed in the first pattern layer includes a plurality of partial regions to be formed in the second pattern layer by the second lithography apparatus, and
   the second pattern layer is formed to overlap with the first pattern layer by transferring a pattern of an original to each of the plurality of partial regions by the second lithography apparatus.

3. The method according to claim 2, wherein the plurality of partial regions include a first partial region arranged at a first position in each shot region, and a second partial region arranged at a second position different from the first position in each shot region, and
   the forming the second pattern layer includes:
   transferring the pattern of the original to the first partial regions by using alignment information obtained as the second alignment information by performing the global alignment method for the first partial region of the plurality of shot regions, and
   transferring the pattern of the original to the second partial region by using alignment information obtained as the second alignment information by performing the global alignment method for the second partial region of the plurality of shot regions.

4. The method according to claim 3, wherein
processing of transferring the pattern of the original to the first partial region by the second lithography apparatus is performed on the plurality of shot regions, and then processing of transferring the pattern of the original to the second partial region by the second lithography apparatus is performed on the plurality of shot regions.

5. The method according to claim 1, wherein the plurality of alignment marks are formed on the substrate by using the second lithography apparatus.

6. The method according to claim 1, wherein the second alignment information is used in common among a plurality of substrates.

7. The method according to claim 1, wherein the first lithography apparatus is an imprint apparatus configured to form the first pattern layer of an imprint material on the substrate by using a mold.

8. The method according to claim 1, wherein the second lithography apparatus is an exposure apparatus configured to transfer a pattern of an original to the substrate via a projection optical system.

9. A method of manufacturing an article, the method comprising step of:
forming a pattern on a substrate using a pattern forming method;
processing the substrate, on which the pattern has been formed, to manufacture the article,
wherein the pattern forming method is a method of forming a plurality of pattern layers on a substrate by using a plurality of lithography apparatuses including a first lithography apparatus adopting a die-by-die alignment method and a second lithography apparatus adopting a global alignment method, and includes:
forming only a plurality of alignment marks on the substrate, by using a lithography apparatus which adopts a global alignment method;
forming a first pattern layer on the substrate by using the first lithography apparatus, based on first alignment information obtained by performing the die-by-die alignment method for the plurality of marks formed on the substrate; and then
forming a second pattern layer on the substrate so as to overlap with the first pattern layer, by using the second lithography apparatus, based on second alignment information obtained by performing the global alignment method for a plurality of shot regions in the first pattern layer to which patterns have been respectively formed by the first lithography apparatus.

10. The method according to claim 1, wherein the plurality of alignment marks are formed on the substrate on which patterns and marks have not been formed.

11. The method according to claim 1, wherein the lithography apparatus for forming the plurality of alignment marks has a higher precision in controlling a position of the substrate, as compared with the first lithography apparatus.

12. The method according to claim 1, wherein
the plurality of pattern layers are formed on each of a plurality of substrates, and
the first alignment information is obtained for each of the plurality of substrates, and the second alignment information is obtained from one of the plurality of substrates and used in common among the plurality of substrates.

13. A pattern forming method of forming a pattern layer on a substrate,
wherein the substrate is configured by forming only a plurality of alignment marks by using a lithography apparatus adopting a global alignment method, and then forming a first pattern layer by using a first lithography apparatus adopting a die-by-die alignment method, based on first alignment information obtained by performing the die-by-die alignment method for the plurality of alignment marks,
wherein the pattern forming method comprises forming a second pattern layer on the substrate so as to overlap with the first pattern layer, by using a second lithography apparatus adopting a global alignment method, based on second alignment information obtained by performing the global alignment method for a plurality of shot regions in the first pattern layer to which patterns have been respectively formed by the first lithography apparatus.

14. The method according to claim 13, wherein
each of the plurality of shot regions formed in the first pattern layer includes a plurality of partial regions to be formed in the second pattern layer by the second lithography apparatus, and
the second pattern layer is formed to overlap with the first pattern layer by transferring a pattern of an original to each of the plurality of partial regions by the second lithography apparatus.

15. The method according to claim 14, wherein
the plurality of partial regions include a first partial region arranged at a first position in each shot region, and a second partial region arranged at a second position different from the first position in each shot region, and
the forming the second pattern layer includes:
transferring the pattern of the original to the first partial regions by using alignment information obtained as the second alignment information by performing the global alignment method for the first partial region of the plurality of shot regions, and
transferring the pattern of the original to the second partial region by using alignment information obtained as the second alignment information by performing the global alignment method for the second partial region of the plurality of shot regions.

16. The method according to claim 15, wherein
processing of transferring the pattern of the original to the first partial region by the second lithography apparatus is performed on the plurality of shot regions, and then processing of transferring the pattern of the original to the second partial region by the second lithography apparatus is performed on the plurality of shot regions.

17. The method according to claim 13, wherein the plurality of alignment marks are formed on the substrate by using the second lithography apparatus.

18. The method according to claim 13, wherein the second alignment information is used in common among a plurality of substrates.

19. The method according to claim 13, wherein the first lithography apparatus is an imprint apparatus configured to form the first pattern layer of an imprint material on the substrate by using a mold.

20. The method according to claim 13, wherein the second lithography apparatus is an exposure apparatus configured to transfer a pattern of an original to the substrate via a projection optical system.

21. The method according to claim 13, wherein the plurality of alignment marks are formed on the substrate on which patterns and marks have not been formed.

22. The method according to claim 13, wherein the lithography apparatus for forming the plurality of alignment marks has a higher precision in controlling a position of the substrate, as compared with the first lithography apparatus.

23. The method according to claim 13, wherein the first alignment information is obtained for each of the plurality of substrates, and the second alignment information is obtained from one of the plurality of substrates and used in common among the plurality of substrates.

24. A method of manufacturing an article, the method comprising:
forming a pattern on a substrate using a pattern forming method; and
processing the substrate, on which the pattern has been formed, to manufacture the article,
wherein the substrate for forming the pattern using the pattern forming method is configured by forming only a plurality of alignment marks by using a lithography apparatus adopting a global alignment method, and then forming a first pattern layer by using a first lithography apparatus adopting a die-by-die alignment method, based on first alignment information obtained by performing the die-by-die alignment method for the plurality of alignment marks, and
wherein the pattern forming method comprises forming a second pattern layer on the substrate so as to overlap with the first pattern layer, by using a second lithography apparatus adopting a global alignment method, based on second alignment information obtained by performing the global alignment method for a plurality of shot regions in the first pattern layer to which patterns have been respectively formed by the first lithography apparatus.

25. The method according to claim 1, wherein the lithography apparatus for forming the plurality of alignment marks has a higher reproducibility of alignment mark arrangement between a plurality of substrates than the first lithography apparatus.

26. The method according to claim 13, wherein the lithography apparatus for forming the plurality of alignment marks has a higher reproducibility of alignment mark arrangement between a plurality of substrates than the first lithography apparatus.

27. A pattern forming method of forming a plurality of pattern layers on a substrate by using a plurality of lithography apparatuses including a first lithography apparatus adopting a die-by-die alignment method and a second lithography apparatus adopting a global alignment method, the pattern forming method comprising:
forming a plurality of alignment marks on the substrate, by using a lithography apparatus which has a higher reproducibility of alignment mark arrangement between a plurality of substrates than the first lithography apparatus;
forming a first pattern layer as a pattern layer formed firstly on the substrate by using the first lithography apparatus, based on first alignment information obtained by performing the die-by-die alignment method for the plurality of marks formed on the substrate; and then
forming a second pattern layer on the substrate so as to overlap with the first pattern layer, by using the second lithography apparatus, based on second alignment information obtained by performing the global alignment method for a plurality of shot regions in the first pattern layer to which patterns have been respectively formed by the first lithography apparatus.

28. A method of manufacturing an article, the method comprising step of:
forming a pattern on a substrate using a pattern forming method;
processing the substrate, on which the pattern has been formed, to manufacture the article,
wherein the pattern forming method is a method of forming a plurality of pattern layers on a substrate by using a plurality of lithography apparatuses including a first lithography apparatus adopting a die-by-die alignment method and a second lithography apparatus adopting a global alignment method, and includes:
forming a plurality of alignment marks on the substrate, by using a lithography apparatus which has a higher reproducibility of alignment mark arrangement between a plurality of substrates than the first lithography apparatus;
forming a first pattern layer as a pattern layer formed firstly on the substrate by using the first lithography apparatus, based on first alignment information obtained by performing the die-by-die alignment method for the plurality of marks formed on the substrate; and then
forming a second pattern layer on the substrate so as to overlap with the first pattern layer, by using the second lithography apparatus, based on second alignment information obtained by performing the global alignment method for a plurality of shot regions in the first pattern layer to which patterns have been respectively formed by the first lithography apparatus.

29. A pattern forming method of forming a pattern layer on a substrate,
wherein the substrate is configured by forming a plurality of alignment marks by using a lithography apparatus which has a higher reproducibility of alignment mark arrangement between a plurality of substrates than the first lithography apparatus, and then forming a first pattern layer as a pattern layer formed firstly by using a first lithography apparatus adopting a die-by-die alignment method, based on first alignment information obtained by performing the die-by-die alignment method for the plurality of alignment marks,
wherein the pattern forming method comprises forming a second pattern layer on the substrate so as to overlap with the first pattern layer, by using a second lithography apparatus adopting a global alignment method, based on second alignment information obtained by performing the global alignment method for a plurality of shot regions in the first pattern layer to which patterns have been respectively formed by the first lithography apparatus.

30. A method of manufacturing an article, the method comprising:
forming a pattern on a substrate using a pattern forming method; and
processing the substrate, on which the pattern has been formed, to manufacture the article,
wherein the substrate for forming the pattern using the pattern forming method is configured by forming a plurality of alignment marks by using a lithography apparatus which has a higher reproducibility of alignment mark arrangement between a plurality of substrates than the first lithography apparatus, and then forming a first pattern layer as a pattern layer formed firstly by using a first lithography apparatus adopting a die-by-die alignment method, based on first alignment information obtained by performing the die-by-die alignment method for the plurality of alignment marks, and wherein the pattern forming method comprises forming a second pattern layer on the substrate so as to overlap with the first pattern layer, by using a second lithography apparatus adopting a global alignment method, based on second alignment information obtained by performing the global alignment method for a plurality of shot regions in the first pattern layer to which patterns have been respectively formed by the first lithography apparatus.

* * * * *